(12) United States Patent
Trost et al.

(10) Patent No.: US 7,113,428 B2
(45) Date of Patent: Sep. 26, 2006

(54) METHOD FOR OPERATING A MEMORY CELL ARRAY

(75) Inventors: Stefan Trost, Radebeul (DE); Georg Tempel, Dresden (DE); Matthias Ernst, Dresden (DE); Martin Steinbrück, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/954,642

(22) Filed: Sep. 30, 2004

(65) Prior Publication Data

US 2005/0105353 A1    May 19, 2005

(30) Foreign Application Priority Data

Sep. 30, 2003  (DE) ................ 103 45 518
Dec. 10, 2003  (DE) ................ 103 57 777

(51) Int. Cl.
*G11C 16/04* (2006.01)

(52) U.S. Cl. .................. 365/185.18; 365/185.28

(58) Field of Classification Search ........... 365/185.17, 365/185.18, 185.28, 185.29, 185.33
See application file for complete search history.

(56) References Cited

U.S. PATENT DOCUMENTS

| | | | |
|---|---|---|---|
| 6,195,292 B1 * | 2/2001 | Usuki et al. | 365/185.28 |
| 6,272,050 B1 * | 8/2001 | Cunningham et al. | 365/185.28 |
| 6,392,929 B1 | 5/2002 | Kim et al. | |
| 6,639,835 B1 * | 10/2003 | Forbes | 365/185.28 |

* cited by examiner

*Primary Examiner*—Trong Phan
(74) *Attorney, Agent, or Firm*—Slater & Matsil, L.L.P.

(57) ABSTRACT

Prior to the reprogramming of a selected flash memory cell of a memory cell array, electrons being removed from the memory layer (M) in the channel region (C) by Fowler-Nordheim tunneling, a lower potential for incipient programming of the memory cell is applied to the relevant word line ($WL_n$) while the associated bit line ($BL_m$) remains at the basic potential. What is thereby achieved is that a gate disturb occurring during the programming operation does not lead to erratic bits along the affected word line ($WL_n$).

25 Claims, 5 Drawing Sheets

METHOD FOR OPERATING A MEMORY CELL ARRAY

This application claims priority to German Patent Application 103 45 518.3, which was filed Sep. 30, 2003, and to German Patent Application 103 57 777.7, which was filed Dec. 10, 2003, both applications of which are incorporated herein by reference.

TECHNICAL FIELD

The present invention relates generally to a memory cell, and more particularly to a method for operating a memory cell array.

BACKGROUND

The memory cells of a semiconductor memory component in each case have a transistor structure having a channel region in semiconductor material between source and drain, a gate electrode electrically insulated from the channel region, and associated electrical terminals. In a memory cell array with NOR architecture, for example, the gate electrodes are connected to one another row-wise via word lines and the drain regions are connected to one another column-wise via bit lines. For the programming of a memory cell, a memory layer is situated between the gate electrode and the channel, which memory layer is electrically insulated both from the gate electrode and from the semiconductor material of the channel region and may be a floating gate electrode, for example. A floating gate electrode is formed by an electrical conductor that is electrically insulated all around and is not connected to any potential. Charge carriers, preferably electrons, may be accumulated on the floating gate electrode and define the programming state.

Depending on the cell conception, the electrons pass for example by Fowler-Nordheim tunneling through the electrically insulating material between the channel region and the floating gate electrode or by injection of hot electrons from the channel (CHE, channel hot electrons) onto the floating gate electrode. In the case of the last-mentioned programming operation, electrons are accelerated in the channel region and pass as hot, i.e., high-energy, electrons via the lower insulation layer (gate oxide) into the memory layer. In the case of such memory cells, the erase operation is effected by Fowler-Nordheim tunneling of charge carriers through one of the insulation layers bounding the memory layer.

Instead of a memory layer made of conductive material, electrically insulating material may also be provided, as in the case of so-called charge trapping memory cells, in which the memory layer is, for example, a nitride layer between oxide layers. During the programming operation, electrons are accelerated in the channel region and pass as hot, i.e., high-energy, electrons through the lower oxide layer into the memory layer made of nitride. During the erase operation, Fowler-Nordheim tunneling of charge carriers through one of the oxide layers is effected in the case of such memory cells, too.

The further explanations relate specifically to the case of a flash cell with a floating gate electrode. A potential of 0 volts (ground) is in each case assumed as basic potentials for the word lines and the bit lines. During an erase operation of a memory cell row, a positive voltage is applied to the relevant word line, which voltage draws electrons onto the floating gate. During a programming operation by which a bit is written to the memory cell (write), a negative electrical potential is applied to the associated word line. The bit line of the column of the relevant memory cell is connected to a positive potential, while the nonselected columns have a bit line voltage of 0 volts. The negative electrical potential on the word line is present at all the gate electrodes of the memory cells of the relevant row. As a result, a so-called gate disturb occurs at all the nonselected memory cells and, in the case of the predominant number of memory cells, leaves the information stored therein unchanged.

However, there are a certain number of memory cells, which exhibit a significant shift in the threshold voltage after a gate disturb, so that the relevant cell is practically reprogrammed. Consequently, the relevant cell fails as an information carrier or must at least be programmed anew. These sporadically and randomly distributed incorrect programmings of the information content are referred to as erratic bits. Each memory cell may have such an incorrect behavior with a certain probability in each programming cycle. However, the entire memory is already incorrectly programmed if just a single bit has been incorrectly programmed. Therefore, an incorrect programming of the entire memory may occur with a relatively high probability in each programming cycle. However, the erratic bits do not have the effect that the memory as such is defective; the memory cells with erratic bits may already have a normal behavior again in the next cycle.

In principle, any cell may be affected by the occurrence of erratic bits. As a result, incorrect programmings may occur repeatedly in the application of the memory component. The problem cannot be eliminated by selection of functional components. Hitherto, the cells have been correctly programmed, as necessary, by repeated erase-write cycles. If appropriate, the error rate of the memory chip is reduced by means of an ECC (error correction code) at least to an extent such that specified product requirements are complied with. It would be desirable, however, to have a flash memory chip in which the occurrence of erratic bits is at least largely avoided.

SUMMARY OF THE INVENTION

In one aspect, the invention specifies a possibility for reducing the occurrence of erratic bits on account of a gate disturb in the case of flash memory chips.

In a preferred embodiment method, the programming state of a memory cell is changed as before by the associated word line having applied to it a first further electrical potential deviating from the basic potential (for example 0 volts, ground) of the word lines and the bit line associated with the memory cell having applied to it a second further electrical potential deviating from the basic potential of the bit lines, so that charge carriers, in particular electrons, tunnel from the memory layer through an electrically insulating region (in particular a sufficiently thin gate oxide provided) into the semiconductor material of the channel or into the gate electrode. Prior to this method step, a third further electrical potential is additionally applied to the word line associated with the relevant memory cell, while the bit lines remain at their basic potential. The value of the third further electrical potential is chosen between the basic potential of the word lines and the value of the first further electrical potential. The value of the third further electrical potential is additionally chosen such that at most such a small gate disturb occurs that the probability of the occurrence of erratic bits is at least very low. Ideally, the occurrence of erratic bits is entirely avoided.

However, the value of the third further electrical potential is chosen in the vicinity of the electrical potential required for the reprogramming of the memory cell to an extent such that a type of incipient programming is affected. Although this does not yet have the effect that the charge carriers leave the memory layer, after this incipient programming all the memory cells on the relevant word line between the memory layer and the semiconductor material or the gate electrode have a sufficient potential threshold in order to effectively prevent tunneling through this region in the case of the memory cells not selected for reprogramming.

A drastic reduction in the occurrence of erratic bits, which is brought about as a result of this and confirmed by measurements can be explained in the following manner: during the actual programming operation, charge carrier pairs are formed at the boundary between the memory layer and the electrically insulating region. The charge carriers having the opposite sign to the programming charge carriers in the memory layer (for example electrons) are cumulated in the electrically insulating region in the vicinity of the boundary with the memory layer. These charge carriers (holes in the example) have the effect of modifying the potential threshold of the electrically insulating region such that charge carriers can tunnel through the potential threshold more easily. In some cases, with a certain probability a cluster of the cumulated charge carriers may occur and these intensify the effect of reducing the potential threshold in such a way that the relevant cells may already be programmed with a lower electric field and have the above-described so-called erratic behavior as a consequence thereof. The method step of incipient programming neutralizes the charge carriers in the electrically insulating material, thereby canceling the alteration of the potential threshold. Only the charge carriers in the selected memory cell are then still able to tunnel through the electrically insulating region and to leave the memory layer.

BRIEF DESCRIPTION OF THE DRAWINGS

Examples of the method will be described in more detail below with reference to the accompanying figures.

The following list of reference symbols can be used in conjunction with the figures:

C Channel
D Drain
G Gate
M Memory layer
S Source
BL Bit line
WL Word line

DETAILED DESCRIPTION OF ILLUSTRATIVE EMBODIMENTS

Figure 1:
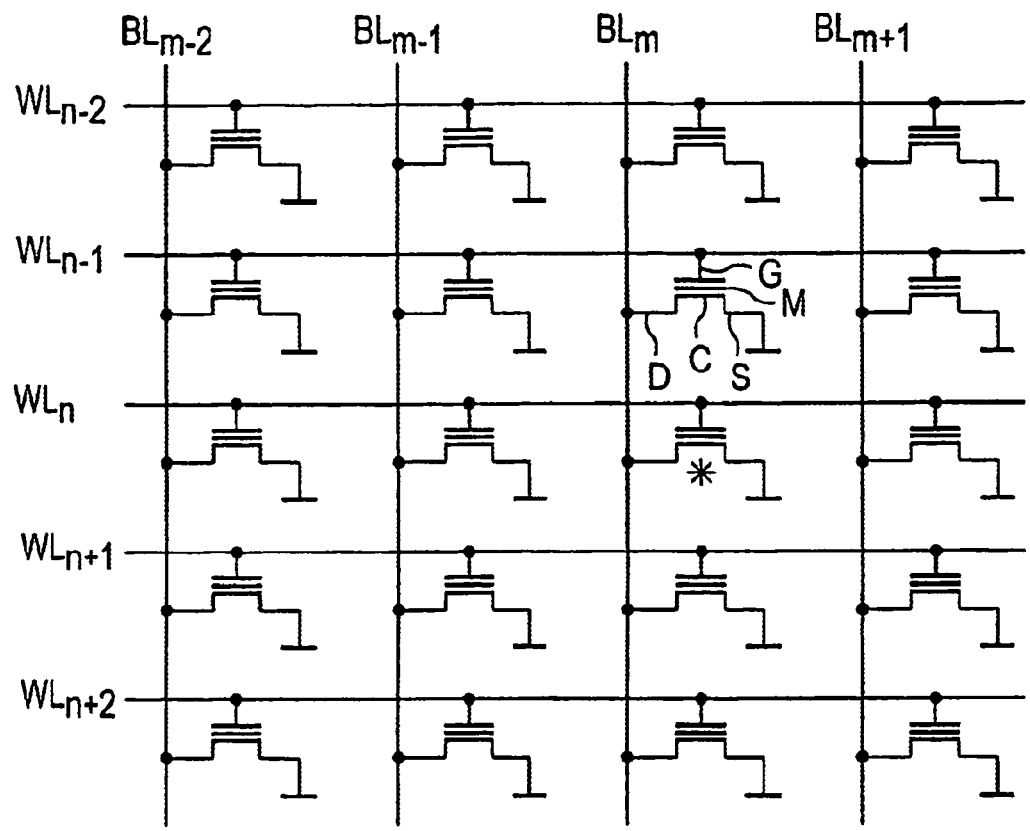
FIG. 1 shows a scheme of a memory cell array.

FIG. 1 shows a detail from a scheme of a memory cell array with floating gate flash memory cells. The word lines $WL_{n-2}$, $WL_{n-1}$, $WL_n$, $WL_{n+1}$, $WL_{n+2}$ in each case connect the gate electrodes G of the memory transistors to one another row-wise. In this example, the bit lines $BL_{m-2}$, $BL_{m-1}$, $BL_m$, $BL_{m+1}$ in each case connect the drain terminals D of the memory transistors to one another; the source terminals S are connected to ground (0 volts). The method according to a preferred embodiment of the invention is not defined for a specific memory architecture. In particular, the source terminals and drain terminals may be interchanged with respect to the example described. The method according to an embodiment of the invention is also suitable for memory cell arrays in which both the source terminals and the drain terminals of the memory cells are in each case connected to separate lines column-wise; in this case, source-drain voltages of different signs are applied for programming and erasure.

The memory layer M, a floating gate electrode in this example, is situated between the gate electrode G and the channel region C. The memory cell provided for reprogramming is marked by an asterisk in FIG. 1. This memory cell is addressed by selection of the word line $WL_n$ and the bit line $BL_m$. This means that the rest of the word lines and bit lines remain at the basic potential, e.g., ground (0 volts) while a first further electrical potential is applied to the word line $WL_n$ leading to the relevant memory cell and a second further electrical potential is applied to the bit line $BL_m$ leading to the relevant memory cell. If, for programming, electrons, for example, are forced from the floating gate electrode into the channel in order thus to eliminate the negative charge on the floating gate electrode to an extent that suffices for changing the programming state, a potential of typically −10 volts, for example, may be applied to the word line for this purpose. The potential on the bit line $BL_m$ is then typically, e.g., 8 volts.

On account of the (in this example negative) potential on the word line $WL_n$, the result is a gate disturb of all the memory cells along the word line. In order to avoid the occurrence of erratic bits, in this method firstly a third further electrical potential is applied to the word line $WL_n$ associated with the memory cell, which potential does not have such a large difference with respect to the basic potential as the first further electrical potential. In the example specified, the third further electrical potential may typically be −8 volts. All the bit lines remain at the basic potential, that is to say ground (0 volts) in this example. This also applies to the bit line $BL_m$ associated with the relevant memory cell. In this step of incipient programming, the gate electrodes of the memory cells present on the relevant word line $WL_n$ are brought to a negative potential such that precisely such a small gate disturb occurs that erratic bits are brought about only with a very low probability. However, this method step prepares the memory cells along the word line $WL_n$ such that they permit no erratic bits to occur during the actual reprogramming in the course of which the first further electrical potential is applied to the word line $WL_n$ and the second further electrical potential is applied to the bit line $BL_m$.

Figure 2:
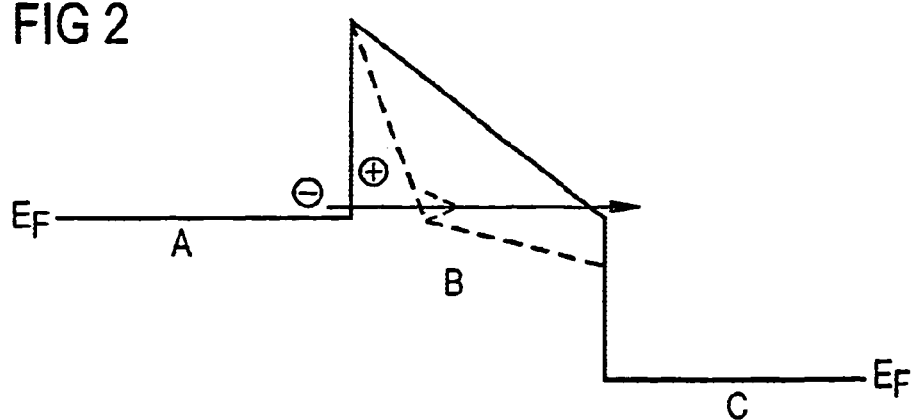
FIG. 2 shows an energy diagram for the transition from the memory layer to the semiconductor material.

This becomes clear from the energy diagram illustrated in FIG. 2. The level of the Fermi energy $E_F$, that is to say the highest energy that occurs, of the electrons present in the memory layer when the basic potential is present is illustrated in the region A on the left-hand side of the diagram. This is followed by the region B, illustrating the energy level of the potential threshold of the electrically insulating boundary layer to be tunneled through between the gate electrode and the semiconductor material. On the right-hand side of the diagram, the region C illustrates the channel region with the level of the Fermi energy $E_F$ of the electrons that is present there. The formation of charge carrier pairs at the boundary between the memory layer and the boundary layer gives rise to positive charge carriers (holes) which are predominantly cumulated near the interface with the memory layer in the boundary layer. This is indicated by the plus symbol in the circle in FIG. 2. The plus symbol is depicted above the level of the Fermi energy in the region A in order to indicate that the positive charge carriers there have an energy above the Fermi energy of the electrons in the region A.

Through the application of a sufficiently high negative potential, namely of the third further electrical potential, the energy of some electrons in the memory layer (region A) is raised such that they can neutralize the positive charge carriers in the insulating material (region B). While the energy level of the potential threshold in the region B, given the presence of the positive charge carriers, typically has a profile in accordance with the line depicted in dashed fashion, the form of the potential threshold in accordance with the solid lines results after the neutralization of the charge carriers. Tunneling through the electrically insulating region is therefore made considerably more difficult for the electrons (minus symbol in the circle). As illustrated by the solid arrow pointing toward the right, almost the entire region B has to be tunneled through, whereas in the case of positive charge carriers being present and thus the potential threshold profile depicted in dashed fashion, it is only necessary to pass the relatively narrow potential threshold in accordance with the arrow depicted in dashed fashion.

On the basis of this model presentation, the value of the third further electrical potential to be applied for a respective memory cell array can be found in a suitable manner. The third further electrical potential is chosen in a suitable manner in most applications if the magnitude of the difference between the values of the first and third further electrical potentials is at most one fifth of the magnitude of the difference between the values of the first further electrical potential and the basic potential (0 volts, ground) of the word line.

The memory layer of the memory cell may comprise a charge trapping memory layer made of electrically insulating material. The memory layer may comprise a silicon nitride layer, each memory cell further comprising a first silicon oxide layer overlying the silicon nitride layer, and a second silicon oxide layer underlying the silicon nitride layer.

Figure 3:
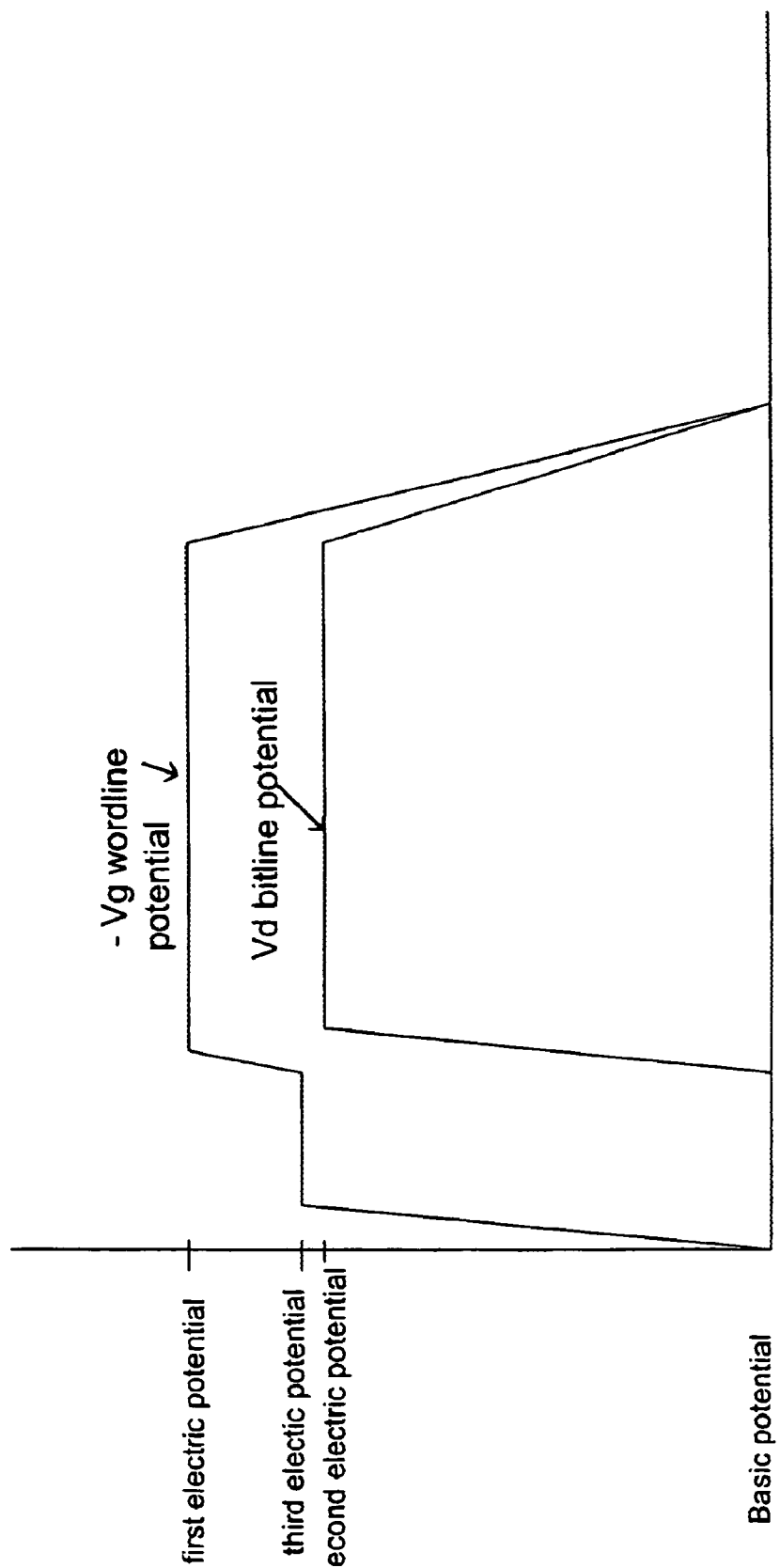
FIG. 3 shows a voltage diagram illustrating the potentials on the word line and bit lines during the programming of a memory cell in the memory cell array using the methods of the invention.

FIG. 3 illustrates the potentials applied to the memory cell word lines and bit lines using the programming method of the invention. The word line potentials are depicted as negative values in this example (labeled "−Vg wordline potential" in FIG. 3). As described above, the potentials of the word lines and the bit lines (labeled "Vd bitline potential" in FIG. 3) begin at a basic potential. Prior to application of a second electric potential to the bit lines and the first electric potential deviating from the basic electric potential to the word lines, the third electric potential is applied to the word lines while the bit lines remain at the basic potential.

Figure 4:
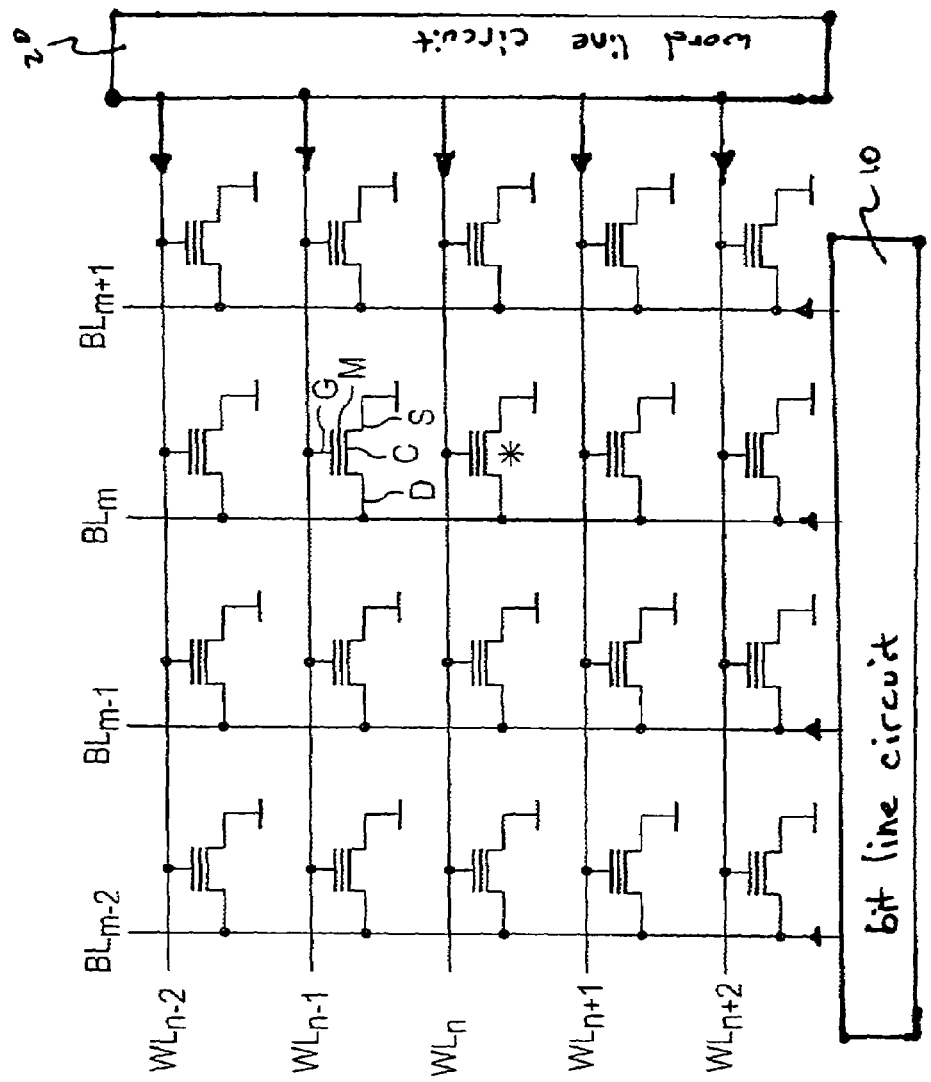
FIG. 4 shows the scheme of a memory cell array of FIG. 1 and a first circuit coupled to the bit lines for applying potentials and a second circuit coupled to the word lines for applying potentials.

FIG. 4 illustrates the scheme of the memory cell array of FIG. 1 and a first circuit 10 coupled to the bit lines including the selected bit line $BL_m$ for applying the potentials to the bit lines and a second circuit 20 coupled to the word lines including the selected word line $WL_n$ for applying the potentials to the word lines so as to perform the methods of the invention as described above.

Figure 5:
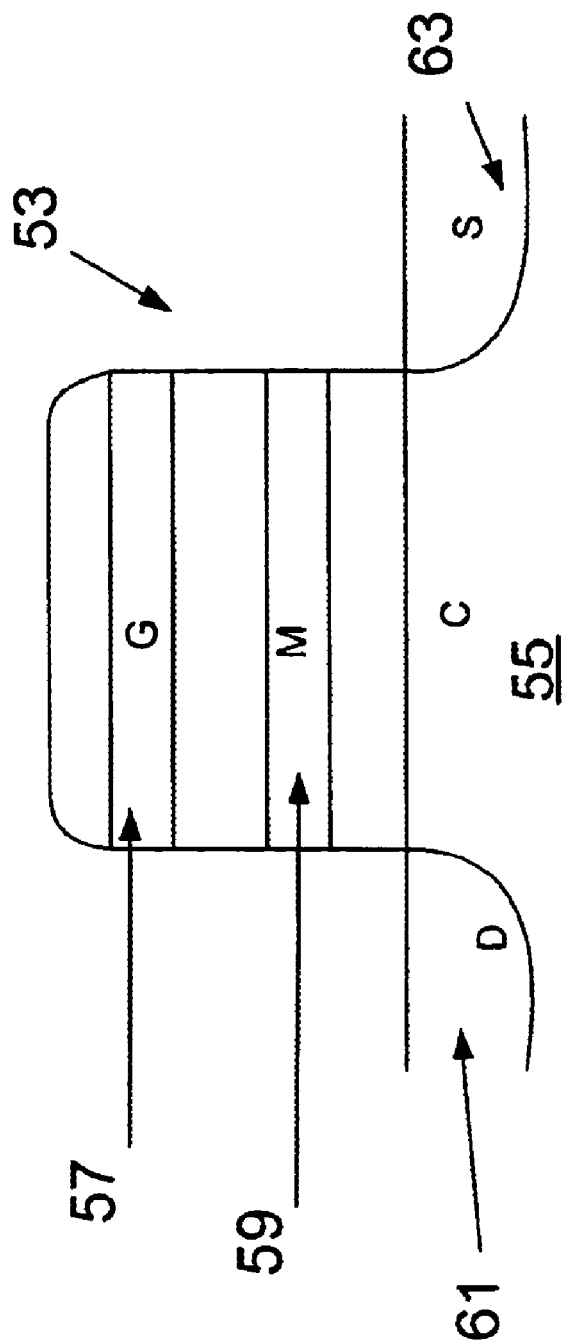
FIG. 5 shows a memory cell having a floating gate memory layer.

FIG. 5 illustrates a memory cell 51 of the prior art using a floating gate. Substrate 55 has drain region 61 and source region 63 formed on opposite sides of the channel region. Memory layer 59 is formed above the channel region as a floating gate and gate 57 is formed in insulating oxide 53 above the floating gate 59.

Figure 6:
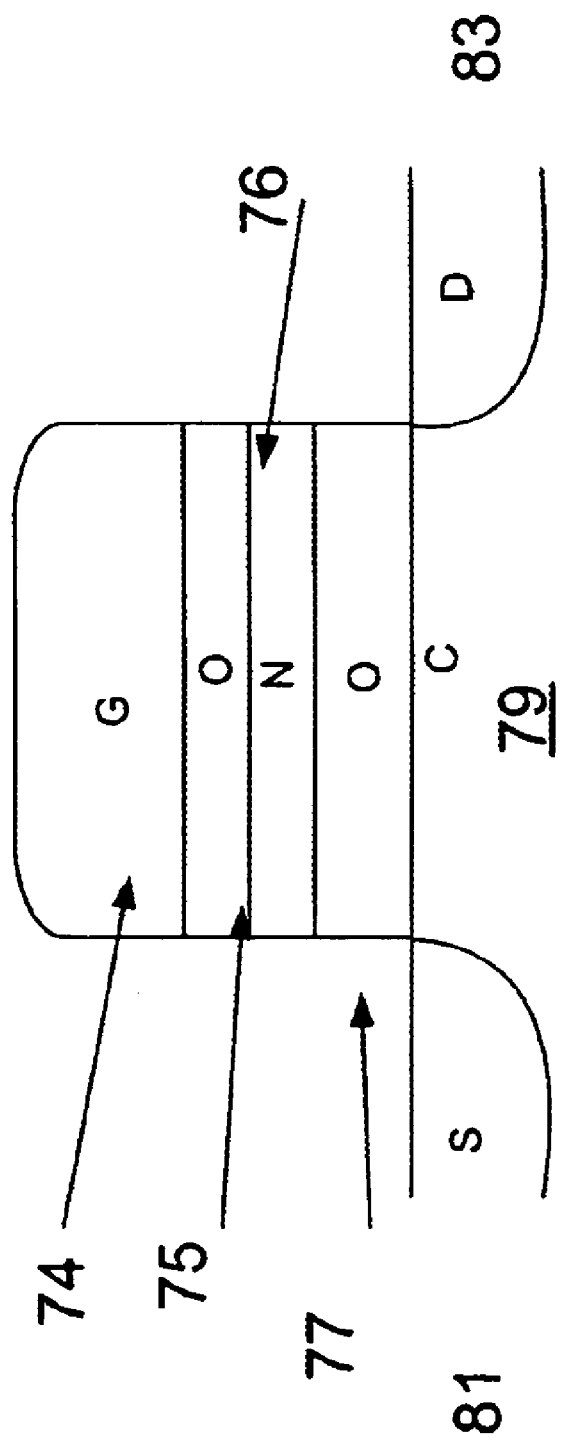
FIG. 6 shows a memory cell having a charge trapping memory layer.

FIG. 6 illustrates a memory cell 71 of the prior art using a charge trapping region as the memory layer. Source region 81 and drain region 83 are formed opposing the channel region, and a nitride charge trapping layer 76 is formed with an oxide layer 75 formed over it and an oxide layer 77 formed underlying it, control gate 74 is formed overlying the charge trapping region.

What is claimed is:
1. A memory cell ray comprising:
 a plurality of memory cells, each memory cell comprising:
  a channel region disposed in a semiconductor material between a source and a drain;
  a gate electrode electrically insulated from the channel region; and
  a memory layer between the channel region and the gate electrode, the memory layer being electrically insulated both from the semiconductor material and from the gate electrode;
 a plurality of word lines coupled to the memory cells such that gate electrodes of memory cells along a row are electrically coupled and are at a basic potential; and a plurality of bit lines coupled to the memory cells such that at least one of the source and/or the drain of memory cells along a column are electrically coupled and are at a basic potential;

wherein a programming state of a memory cell is changed by an associated word line having applied to it a first electrical potential deviating from its basic potential and an associated bit line having applied to it a second electrical potential deviating from its basic potential, so that responsive to the application of the first and second electrical potentials, charge carriers of the memory layer of the memory cell tunnel through an electrically insulating region into the semiconductor material or into the gate electrode; and wherein, prior to applying the first electrical potential and the second electrical potential, applying a third electrical potential to the word line associated with the memory cell to be programmed, while the bit lines remain at their basic potential, the value of the third electrical potential lying between the basic potential of the word line and the first electrical potential.

2. The memory cell array as claimed in claim 1, wherein the memory layer comprises a floating gate electrode.

3. The memory cell as claimed in claim 1, wherein the memory layer comprises a charge trapping memory layer made of electrically insulating material.

4. The memory cell array as claimed in claim 3, wherein the memory layer comprises a silicon nitride layer, each memory cell further comprising a first silicon oxide layer overlying the silicon nitride layer and a second silicon oxide layer underlying the silicon nitride layer.

5. The memory cell array as claimed in claim 1, wherein the third electrical potential is chosen such that a gate disturb brought about by the application of the first electrical potential to the word line associated with, the memory cell to be programmed effects haphazard changes in the programming state of memory cells associated with said word line only in a number that is at least reduced compared with operation of the memory cell array without prior application of the third electrical potential.

6. The memory cell array as claimed in claim 1, wherein the magnitude of the difference between the first and third electrical potentials is at most one fifth of the magnitude of the difference between the first electrical potential and the basic potential of the word lines.

7. A memory device comprising:
a plurality of memory cells, each memory cell comprising:
a channel region disposed in a semiconductor material between a source and a drain;
a gate electrode electrically insulated from the channel region; and
a memory layer between the channel region and the gate electrode, the memory layer being electrically insulated both from the semiconductor material and from the gate electrode;
a plurality of word lines coupled to the memory cells such that gate electrodes of memory cells along a row are electrically coupled;
a plurality of bit lines coupled to the memory cells such that at least one of the source and/or the drain of memory cells along a column are electrically coupled and are at basic electrical potential;
a first circuit coupled to each of the bit lines, the first circuit causing a selected bit line to be placed at a second electrical potential and remaining bit lines to be held at the basic electrical potential, the second electrical potential deviating from the basic electrical potential; and a second circuit coupled to each of the word lines, the second circuit causing a selected word line to be placed at a first potential and remaining word lines to be held at a basic electrical potential, the first electrical potential deviating from that basic electrical potential, the second circuit causing a third electrical potential to be applied to the selected word line prior to placing the selected word line at the first electrical potential and placing the selected bit line at the second electrical potential while the remaining bit lines remain at the basic electrical potential, the third electrical potential having a value lying between the basic potential of the word line and the first electrical potential.

8. The memory device as claimed in claim 7, wherein the first and second circuits cause carriers of the memory layer of the memory cell to tunnel through an electrically insulating region into the semiconductor material.

9. The memory device as claimed in claim 7, wherein the first and second circuits cause carriers of the memory layer of the memory cell to tunnel through an electrically insulating region into the gate electrode.

10. The memory device as claimed in claim 7, wherein the memory layer comprises a floating gate electrode.

11. The memory cell as claimed in claim 7, wherein the memory layer comprises a charge trapping memory layer made of electrically insulating material.

12. The memory cell array as claimed in claim 11, wherein the memory layer comprises a silicon nitride layer, each memory cell further comprising a first silicon oxide layer overlying the silicon nitride layer and a second silicon oxide layer underlying the silicon nitride layer.

13. A method for operating a memory cell array comprising memory cells each having a channel region in semiconductor material between source and drain, a gate electrode electrically insulated from the channel region; and a memory layer between the channel region and the gate electrode, the memory layer being electrically insulated both from the semiconductor material and from the gate electrode, wherein the memory cells are connected row-wise to word lines that in each case connect the gate electrodes of the respective memory cells and are at a basic word line electrical potential, and being connected column-wise to bit lines that in each case connect source terminals and/or drain terminals of the respective memory cells and are at a bit line basic electrical potential, the method comprising:
applying a third electrical potential to a word line associated with a memory cell to be modified, the third electrical potential being applied while the bit lines remain at the bit line basic electrical potential;
after applying the third electrical potential, applying a first electrical potential to the word line associated with the memory cell to be modified, the first electrical potential deviating from the word line basic potential, wherein the value of the third further electrical potential lies between the basic electrical potential of the word line and the first electrical potential; and
applying a second electrical potential to the bit line associated with the memory cell to be modified, the second electrical potential deviating from the basic potential.

14. The method as claimed in claim 13 wherein application of the first electrical potential, the second electrical potential and the third electrical potential causes charge carriers of the memory layer to tunnel through an electrically insulating region into the semiconductor material.

15. The method as claimed in claim 13 wherein application of the first electrical potential, the second electrical potential and the third electrical potential causes charge carriers of the memory layer to tunnel through an electrically insulating region into the gate electrode.

16. The method as claimed in claim 13, wherein application of the first electrical potential, the second electrical potential and the third electrical potential causes a Fowler-Nordheim tunneling of electrons from the memory layer to be effected.

17. The method as claimed in claim 13, wherein the memory layer comprises a floating gate electrode.

18. The method as claimed in claim 13, wherein the memory layer comprises a charge trapping memory layer made of electrically insulating material.

19. The method as claimed in claim 13, wherein the third electrical potential is chosen such that a gate disturb brought about by the application of the first electrical potential to the word line associated with the memory cell to be modified effects haphazard changes in the programming state of memory cells associated with the word line coupled to the memory cell to be modified only in a number that is at least reduced compared with operation of the memory cell array without prior application of the third electrical potential.

20. The method as claimed in claim 13, wherein the magnitude of the difference between the first and third electrical potentials is at most one fifth of the magnitude of the difference between the first electrical potential and the basic potential of the word lines.

21. The memory array of claim 1, wherein the basic potential is 0 volts.

22. The memory array of claim 21, wherein the first electrical potential is −10 volts.

23. The memory array of claim 22, wherein the third electrical potential is between 0 and −10 volts.

24. The method as claimed in claim 13, wherein the step of applying the first potential to the word line associated with the memory cell to be modified comprises applying a potential of −10 volts.

25. The method as claimed in claim 13, wherein the step of applying the third potential to the word line associated with the memory cell to be modified comprises applying a potential of −8 volts.

* * * * *

UNITED STATES PATENT AND TRADEMARK OFFICE
CERTIFICATE OF CORRECTION

PATENT NO. : 7,113,428 B2 Page 1 of 1
APPLICATION NO. : 10/954642
DATED : September 26, 2006
INVENTOR(S) : Trost et al.

It is certified that error appears in the above-identified patent and that said Letters Patent is hereby corrected as shown below:

Column 7, line 35; delete "with, the" insert --with the--

Signed and Sealed this

Thirteenth Day of February, 2007

JON W. DUDAS
*Director of the United States Patent and Trademark Office*